United States Patent
Bickford et al.

(10) Patent No.: US 7,380,233 B2
(45) Date of Patent: May 27, 2008

(54) METHOD OF FACILITATING INTEGRATED CIRCUIT DESIGN USING MANUFACTURED PROPERTY VALUES

(75) Inventors: Jeanne P. Bickford, Essex Junction, VT (US); Steven M. Fox, Jericho, VT (US); Donald J. Hathaway, Essex Junction, VT (US); Ian P. Stobert, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 11/162,196

(22) Filed: Aug. 31, 2005

(65) Prior Publication Data

US 2007/0050736 A1  Mar. 1, 2007

(51) Int. Cl.
*G06F 17/50* (2006.01)
(52) U.S. Cl. .............. 716/19; 716/2; 716/11; 716/12
(58) Field of Classification Search .......... 716/2, 716/11, 12, 19
See application file for complete search history.

(56) References Cited

U.S. PATENT DOCUMENTS

| | | | |
|---|---|---|---|
| 5,646,870 A | 7/1997 | Krivokapic et al. | 364/578 |
| 5,683,928 A | 11/1997 | Wojnarowski et al. | 437/60 |
| 5,779,922 A | 7/1998 | Boon et al. | 216/16 |
| 5,987,086 A * | 11/1999 | Raman et al. | 716/1 |
| 6,040,226 A | 3/2000 | Wojnarowski et al. | 438/381 |
| 6,634,018 B2 | 10/2003 | Randall et al. | 716/19 |
| 6,709,793 B1 | 3/2004 | Brankner et al. | 430/5 |
| 6,775,818 B2 | 8/2004 | Taravade et al. | 716/21 |
| 2002/0097054 A1* | 7/2002 | Rosenau et al. | 324/441 |

FOREIGN PATENT DOCUMENTS

JP  08-022938  1/1996  ............ 21/27

\* cited by examiner

*Primary Examiner*—Thuan Do
(74) *Attorney, Agent, or Firm*—Downs Rachlin Martin PLLC

(57) ABSTRACT

An integrated circuit (IC) design method for use as a design and/or manufacturing tool for designing and/or manufacturing integrated circuitry (110). The method utilizes one or more library element (150A-F) to provide a flexible modeling template. Each library element includes one or more module ports (160A-F) each for accepting any one of a plurality of device modules (170). The device modules are logical representations of corresponding respective portions of the integrated circuitry. For any given module port, the corresponding device modules may be interchanged essentially without additional integrated circuitry design changes.

20 Claims, 5 Drawing Sheets

METHOD OF FACILITATING INTEGRATED CIRCUIT DESIGN USING MANUFACTURED PROPERTY VALUES

FIELD OF THE INVENTION

The present invention generally relates to the field of integrated circuits. In particular, the present invention is directed to a method of facilitating integrated circuit design.

BACKGROUND OF THE INVENTION

Semiconductor manufacturing processes balance various parameters to produce the complex integrated circuit devices common today. This balance may result in some nominal process variations that create deviations in integrated circuit device performance. These deviations often require adjusting the manufacturing process to re-center certain digital logic parameters.

These adjustments often impact second order devices, such as resistors. This impact may be diminished by applying a re-centering scheme to these second order devices. The modifications to the second order devices resulting from the re-centering, however, typically impart additional changes to the digital logic parameters. Thus, these solutions require a continuing trade-off between process optimization directed to the digital logic and optimization directed to the second order devices.

This trade-off has spawned the development of a variety of mitigation methods presently used in designing semiconductor technology or products. These methods include redesigning products to run a on particular manufacturing line, modifying second order devices to adjust second order properties, and using additional masks in the manufacturing process to tune second order devices separately from the digital logic. These techniques require relatively large investments of time and money that ultimately increase the cost of the final product.

SUMMARY OF THE INVENTION

In one aspect, the present invention is directed to a method of facilitating integrated circuit development. The method comprises providing at least one library element for use in designing an integrated circuit. The at least one library element has at least one module port configured for receiving an integrated circuit device module. At least one set of integrated circuit device modules having differing corresponding respective predetermined property values is provided. Each integrated circuit device module of the at least one set configured to fit the at least one module port. The at least one module port is populated with a first integrated circuit device module of the set so as to produce a first integrated circuit design. The first circuit device module has a desired value for the corresponding respective predetermined property value.

In another aspect, the present invention is directed to a computer readable medium containing computer executable instructions for implementing a method for facilitating integrated circuit development using flexible design elements. The computer executable instructions comprise a first set of computer executable instructions for selecting a library element for use in designing an integrated circuit. The library element has at least one module port configured to receive an integrated circuit device module. A second set of computer executable instructions is provided for storing a set of integrated circuit device modules having differing corresponding respective predetermined property values. Each integrated circuit device module of the set is configured to fit the at least one module port. A third set of computer executable instructions is provided for populating the at least one module port with a first integrated circuit device module of the plurality of integrated circuit device modules to produce a first integrated circuit design. The first circuit device module has a desired value for the corresponding respective predetermined property value.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

In general, the present invention facilitates the design and manufacture of integrated circuit devices. In one aspect, the present invention is directed to an integrated circuit (IC) design method. As described below in more detail, in some applications the design method may be used as a design tool for designing any of a variety of IC devices, such as application specific integrated circuits (ASICs), system-on-chip (SOC) ICs, microprocessors and standalone memory circuits, among others. In other applications, the IC design method may be used as a manufacturing tool, e.g., to adjust the physical design parameters of second order devices to compensate for differences between the design operating parameters and the as-manufactured operating parameters of these devices. Generally, an IC design method of the present invention can promote design flexibility and can readily accommodate production variations in the design of an integrated circuit. These attributes can lead to reduced costs while achieving a desired integrated circuit design.

Figure 1A:
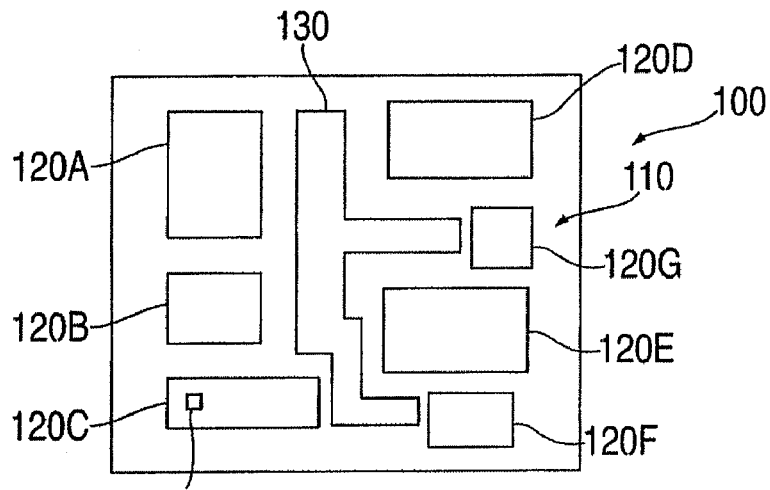
FIG. 1A is a high-level diagram of an integrated circuit (IC) device made in accordance with the present invention.

Referring now to the drawings, FIG. 1A provides an exemplary representation of an IC device 100 made using an IC design method of the present invention. As with many IC devices, IC device 100 may include integrated circuitry 110 configured in an appropriate number of functional blocks 120A-G, e.g. logic blocks, input/output (I/O) blocks, memory blocks, arithmetic logic unit blocks, communications blocks, etc., necessary to suit the functionality of the IC device. As those skilled in the art will understand, IC device 100 may also include one or more other structure(s), e.g., one or more communications busses 130 and/or power, ground and I/O signal networks (not shown), among others, necessary to make the IC device functional. Since the design of IC devices of many sorts are well known in the art, a more detailed description of IC device 100 is not necessary for those skilled in the art to implement an IC design method of the present invention to its fullest scope.

Figure 1B:
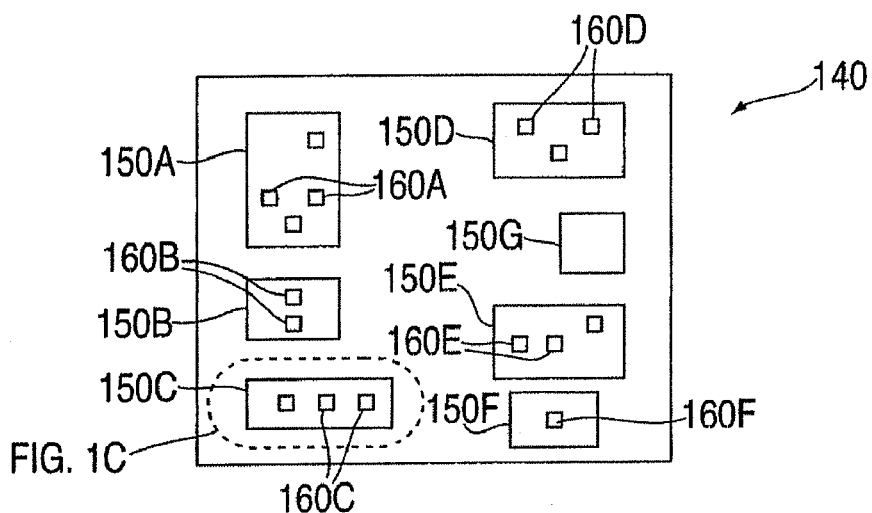
FIG. 1B is a high-level schematic diagram of a graphical computer model of the integrated circuitry of the IC device of FIG. 1A.

Referring to FIG. 1B, and also to FIG. 1A, in developing IC device 100 of FIG. 1A using an IC design method of the present invention, integrated circuitry 110 may be designed using a design tool (not shown) to create a computer model of integrated circuitry 110, e.g., the graphical computer model 140 shown. Computer model 140 may be created using a variety of library elements, in the example shown library elements 150A-G. Each library element 150A-G may be of any type, such as a "standard" library element (i.e. a library element that has been previously created and catalogued) or a "custom" library element (i.e. an element that has been created specifically for making IC device 100). The general concept of laying out ICs, like integrated circuitry 110, using library elements, including library elements 150A-G, is well-known in the art. Consequently, further explanation of this general concept is not necessary for those skilled in the art to understand and practice the present invention.

Unlike conventional library elements like library element 150G, however, library elements 150A-F essentially provide flexible design templates that allow integrated circuitry 110 to be designed and re-designed as needed, e.g., for mitigating the effects of variations in the processing techniques used to manufacture IC device 100. Library elements 150A-F provide this flexibility by allowing certain portions of their logical circuitry representations to be swapped out with similar portions having differing output properties. In order to illustrate the usefulness of library elements 150A-F, if the swappable portions of the library elements are logical representations of secondary devices, such as resistors, the design of integrated circuitry 110 can be optimized for manufacturing by iteratively manufacturing and testing as-manufactured versions of the integrated circuitry using different resistor values as needed to mitigate the effects of processing variations on the functioning of the secondary device resistors. The differing resistor values can be automatically or manually changed for each iteration by swapping out relevant ones of the portions of the library element(s) 150A-F under consideration.

Figure 1C:
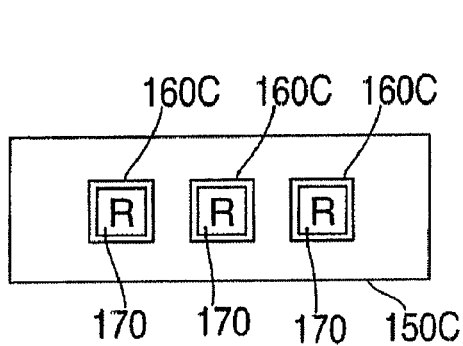
FIG. 1C is an enlarged view of a library element of the graphical computer model of FIG. 1B showing modular device modules installed into corresponding respective module ports of that element.
Figure 1D:
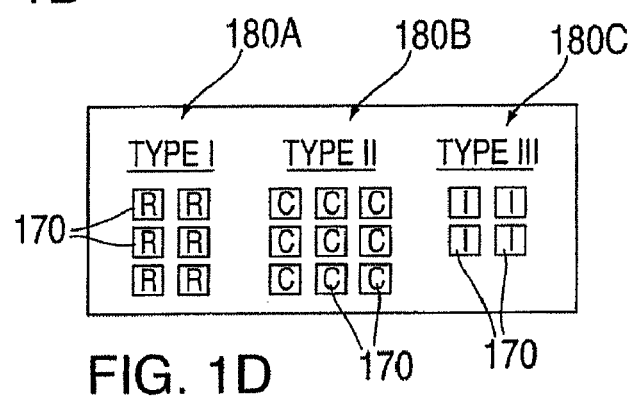
FIG. 1D is a schematic diagram showing sets of differing device modules that can be inserted into the module ports of the library elements of FIG. 1B.

Referring to FIGS. 1B-1D, in order to achieve this swappability, library elements 150A-F may include one or more module ports 160A-F each configured to receive, in seriatim, some or all of a plurality of modular device modules 170 of a corresponding respective set 180A-C of such blocks. Generally, each device module 170 in a particular set 180A-C comprises a logical representation of a certain portion of the integrated circuitry desired to be swappable. Each set 180A-C of device modules 170 contains blocks of the same type, but having differing output property values. For example, if the swappable circuit portion of integrated circuitry 110 consists of a single resistor, all device modules 170 in the corresponding set 180A-C contain a logical representation of a single resistor. However, the resistance values of the plurality of device modules 170 in that set 180A-C will differ from one another.

A modular device module 170 may contain a logical representation of as few as a single device, e.g., resistor, transistor, capacitor, etc., or, in other cases, as many devices as necessary to model the swappable circuitry. Regarding the latter, a device module 170 may include a representation of a device cell containing a plurality of discrete devices. The number and locations of module ports 160A-F can vary widely depending upon the particular library element 150A-F under consideration. For example, a library element of the present invention, such as library element 150F, may include as few as a single module port. However, other library elements (not shown) of the present invention may include tens, hundreds, thousands or more module ports.

It is noted that in some cases, all module ports 160A-F of a particular library element 150A-F may be configured to receive device modules 170 of only one set 180A-C. In this case, all of the swappable circuitry portions of functional block 120A-F corresponding to that library element 150A-F would be largely the same, differing perhaps only in their output parameters. In other cases, all module ports 160A-F of all library elements 150A-F may be configured to receive only device modules 170 of a single set 180A-C. In this case, all of the swappable circuitry portions of all of the functional blocks 120A-F corresponding to library elements 150A-F would be largely the same or identical. In yet other cases, one or more of module ports 160A-F may be configured or otherwise be programmed to accept only a subset of modular blocks 170 in a particular one of sets 180A-C. In a case such as this, a particular set 180A-C may have device modules 170 covering a range of output parameters larger than the range of output parameters suitable for a particular application. To facilitate this, the corresponding module ports 160A-F may have built-in logic for selecting only those device modules 170 having in-range parameter outputs or for otherwise excluding out-of range device modules from being installed therein. In still other cases, module ports 160A-F may be designed to utilizes modular blocks 170 in still other ways. Since the application of an IC design method of the present invention varies with the type of integrated circuitry being designed/laid out therewith, so too will the utilization of the module ports and corresponding respective device modules vary. Those skilled in the are will readily appreciate how to implement module ports 160A-F and device modules 170 of the present invention in a variety of applications. Consequently, it is not necessary to exhaustively list all possibilities.

In the context of mitigating the effects of variations in the processing technology that will be used to make IC device 100 (FIG. 1), the anticipated range of device modules 170 suitable for installation in any one of module ports 160A-F may be determined or estimated using techniques known to those in the art. For example, if a particular mitigation scheme involves adjusting the resistance values of second order resistors, those skilled in the art will be able to determine or estimate the minimum anticipated size resistor needed in a particular location of a library element 150A-F as a function of parameters of the circuitry design of the library element itself and parameters flowing from the processing technology. Similarly, based on the same parameters skilled artisans will be able to determine or estimate the maximum anticipated size resistor that may be needed, as well as the appropriate increment between consecutive sizes within the range.

By way of illustration and not limitation, the appropriate range of resistances (which correlates to resistor size) for a particular module port 160A-F may, e.g., be 2 ohms to 10 ohms, with an increment of 1 ohm between successive resistances. Consequently, the corresponding set 180A-C of device modules 170 would consist of nine device modules, each containing a logical representation of resistor having a corresponding respective resistance from 2 ohms to 10 ohms. Alternatively, a particular library of resistor device modules 170 may include, e.g., device modules representing resistors having resistances from 1 ohm to 100 ohms in 0.5 ohm increments. In this example, each module port 160A-F that is to accept any one of the 2 ohm to 10 ohm resistor device modules 170 in 1 ohm increments may contain logic that allows or causes only the appropriate subset of device modules, i.e., the nine device modules having 2-, 3-, 4-, 5-, 6-, 7-, 8-, and 9-ohm resistance, from among the 199 device modules of the global 1 to 100 ohm set to be installed therein.

Figure 2:
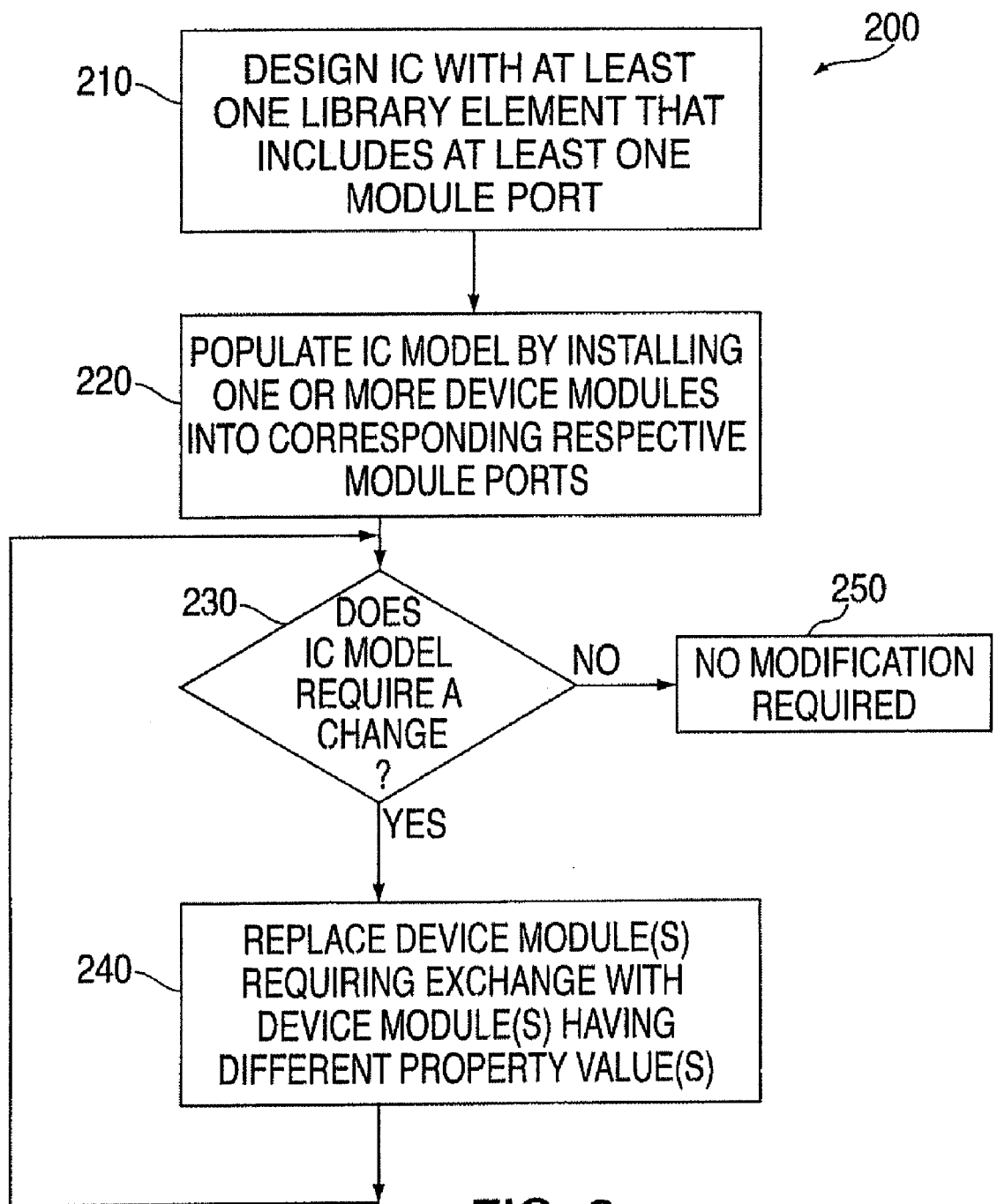
FIG. 2 is a flow diagram illustrating an IC design method of the present invention.

Referring next to FIG. 2, and also to FIGS. 1B-1D, FIG. 2 illustrates an IC design method 200 of the present invention. At step 210, an IC design model, such as computer model 140 (FIG. 1B), may be created using at least one library element of the present invention, e.g., any one or more of library elements 150A-F, that each include one or more module ports, such as any one or more of module ports 160A-F. At step 220, computer model 140 may then be populated by installing one or more device blocks 170 (FIGS. 1C and 1D) into the corresponding respective one or more module ports 160A-F. In general, step 220 provides the initial desired property value for each of the one or more module ports 160A-F just populated. For example, the initial population of each module port 160A-F may involve the selection and installation of a corresponding device module 170 having a logical representation that provides the smallest or otherwise least costly (in terms of, e.g., silicon area, manufacturing cost, manufacturing time, amount of material (s) needed, etc.) circuit portion corresponding to that block. In the context of mitigating the effects of process variations by iteratively re-designing a second order transistor, the initial population may include the selection and installation of the smallest resistor suitable for the processing technology that will be used to make the integrated circuit of the IC design model.

At step 230, a decision is made as to whether or not any one or more of device modules 170 just installed into module ports 160A-F need to be changed. For example, again in the context of mitigating the effects of process variations by re-designing second order devices, once the subject integrated circuitry, e.g., integrated circuitry 110 of FIG. 1A, has been manufactured, it may be determined that the as-manufactured circuitry portion, e.g., circuitry portion 190 (FIG. 1A), corresponding to the one or more device modules 170 has an as-manufactured property value less than needed to optimize the design of integrated circuitry 110. Since circuitry portion 190 is not operating within specifications, it is determined that device module 170 corresponding to circuitry portion 190 needs to be swapped out with a block having a different property value selected with the goal of achieving an in-specification as-manufactured embodiment of integrated circuitry 110. If it is determined at step 230 that one or more device modules 170 require changing by swapping them out with a like block having a different property value, at step 240 the unsatisfactory device modules may be removed from the corresponding respective module ports 160A-F and device modules having different property values inserted therein.

For example, integrated circuitry 110 of FIG. 1A may include a plurality of resistors having a nominal resistance (i.e., property) value (i.e., property value) of 8 ohm. A process variation driven modification to integrated circuitry 110 may require that all 8 ohm resistors be changed to 10 ohm resistors. Typically, resistors having different resistances would have different physical dimensions and/or other parameters that would require a manual modification to the affected portions of integrated circuitry 110 to accommodate the new resistor layout. With the present invention, however, computer model 140 having one or more library elements 150A-F that include module ports corresponding to the subject resistors may be modified simply by replacing the existing device blocks representing an 8 ohm resistor with device blocks representing a 10 ohm resistor. As a result, computer model 140 requires no manual changes to the overall model because the common device footprint corresponding to the affected module port 160A-F is sized so as to accept the full range of resistor sizes in the design range. The modifications of computer model 140 may incorporate changes caused by, but not limited to, device application, device intended use, design variations, manufacturing properties, and any combination thereof.

Once the affected ones of device modules 170 have been swapped out at step 240 with device modules having different property values, IC design method 200 may cycle back to step 230, where it may be determined whether or not computer model 140 needs to be changed by again swapping out affected device modules. If it is determined that one or more device modules 170 need to swapped out, IC design method 200 again proceeds to step 240. Steps 240 and 230 may be repeated as many times as necessary until computer model 140 is acceptable. In the context of utilizing IC design method 200 as a manufacturing tool, the acceptability of computer model 140 may be determined by whether or not integrated circuitry 110, as-manufactured, is functioning properly, has been optimized, and/or is operating within specifications. When at step 230 it is determined that no device modules 170 require swapping out, IC design method 200 may end at block 250, with not further modification required, at least relative to the swapping out of device modules.

Figure 3:
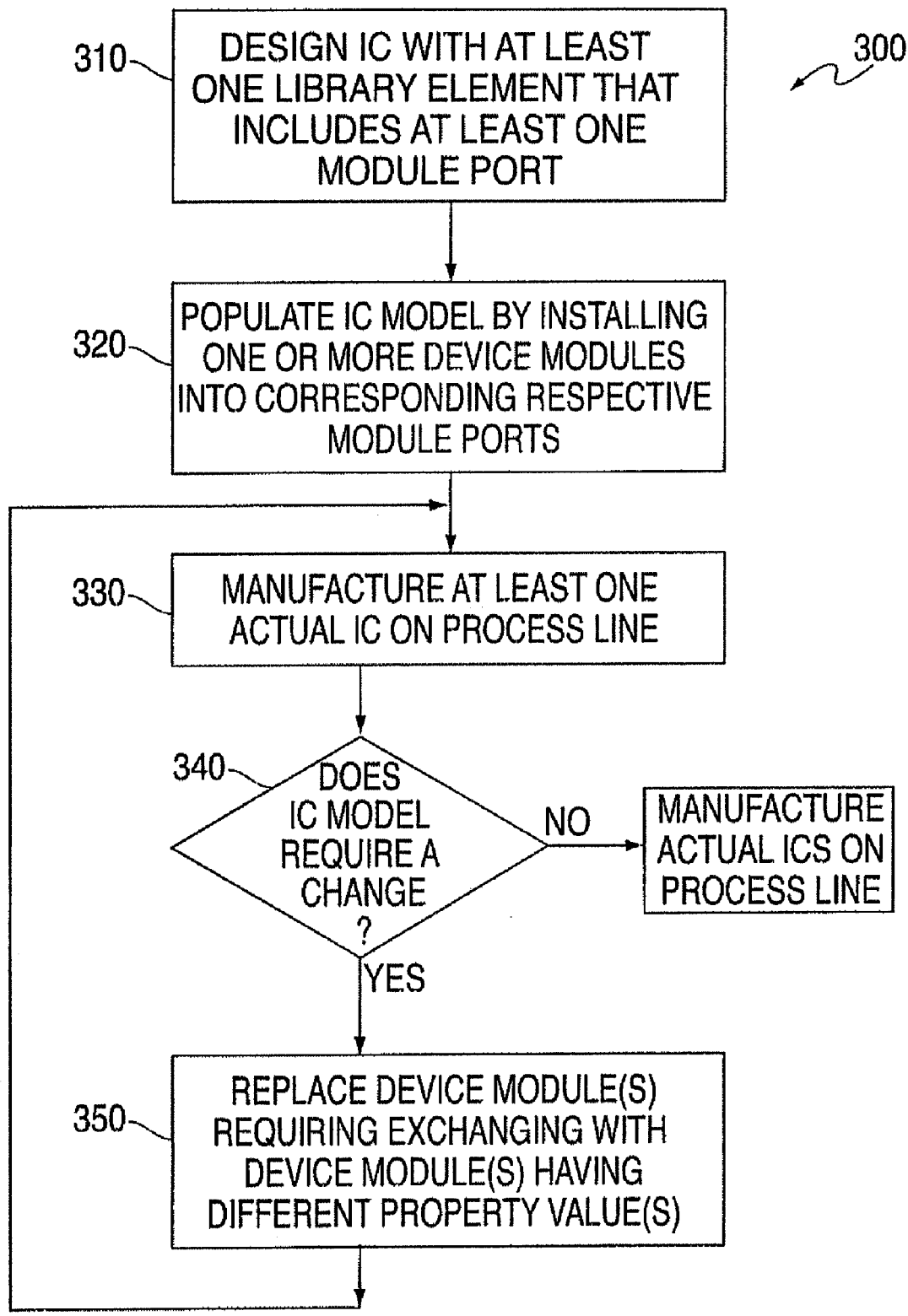
FIG. 3 is a flow diagram illustrating an IC manufacturing method of the present invention.

Referring now to FIG. 3, and also to FIGS. 1A-1D, FIG. 3 illustrates an IC manufacturing method 300 of the present invention. At steps 310 and 320, a computer model, such as computer model 140 of FIG. 1B, may be created and populated in a manner similar to the manner described above in connection with IC design method 200 of FIG. 2. Then, at step 330, the completed computer model 140 may then be communicated to a manufacturing process line for manufacturing of at least one IC device 100 corresponding to the computer model. Once at least one IC device 100 has been manufactured, at step 340 it may be determined whether or not computer model 140 requires modification, e.g., due to the operation of as-manufactured IC device 100 being out of specification. If the as-manufactured IC device 100 tests within specification, IC manufacturing method 300 may return to step 330, where the manufacturing process line produces as-manufactured IC devices 100 in accordance with the initial computer model 140.

However, the manufacturing process may require that the initial computer model 140 be modified relative to the module ports 160A-F. That is, it may be necessary to swap out one or more of the initially installed device modules 170 with alternative device modules having different property values. Consequently, at step 350, the one or more module ports 160A-F identified in step 340 as requiring repopulating may be repopulated by swapping out their device modules 170 with device modules having different property values. The computer model 140 that results from the modification may then be communicated back to the manufacturing process line (step 330) for manufacturing of IC devices 100 in accordance with the new computer model 140. Each of steps 330, 340, and 350 may be repeated as many times as necessary so that as-manufactured IC device is within specifications.

In IC manufacturing method 300, the modification required by the manufacturing process (step 330) may be triggered by an offset property value. The offset property value represents a variation between a nominal design property value and an as-manufactured property value measured on a test integrated circuitry 110 as made by the subject manufacturing process. For example, a typical manufacturing line for producing IC devices requires a period of time after which the manufacturing process stabilizes. After stabilization, an as-manufactured property value may be measured on one or more sample IC devices, such as those consistent with computer model 140. The measured as-manufactured property value may then be compared to a corresponding design property value desired during the IC design so as to determine an offset property value. The decision as to whether or not a particular module port 160A-F requires its installed device module 170 to be swapped out and, optionally, the determination of the magnitude of the property value that is needed for the device module being swapped in, may be made as a function of the offset property value. In the former case, the decision of whether or not a swap is appropriate may be made, e.g., by comparing the offset property value to a threshold or other critical value above which or below which the circuit portion 190 under consideration is out of specification. In the latter, if it is determined based on the immediately foregoing comparison that a swap needs to occur, the particular device module 170 that needs to be swapped in may be determined, e.g., by the magnitude of the difference between the offset property value and the critical value.

Figure 4:
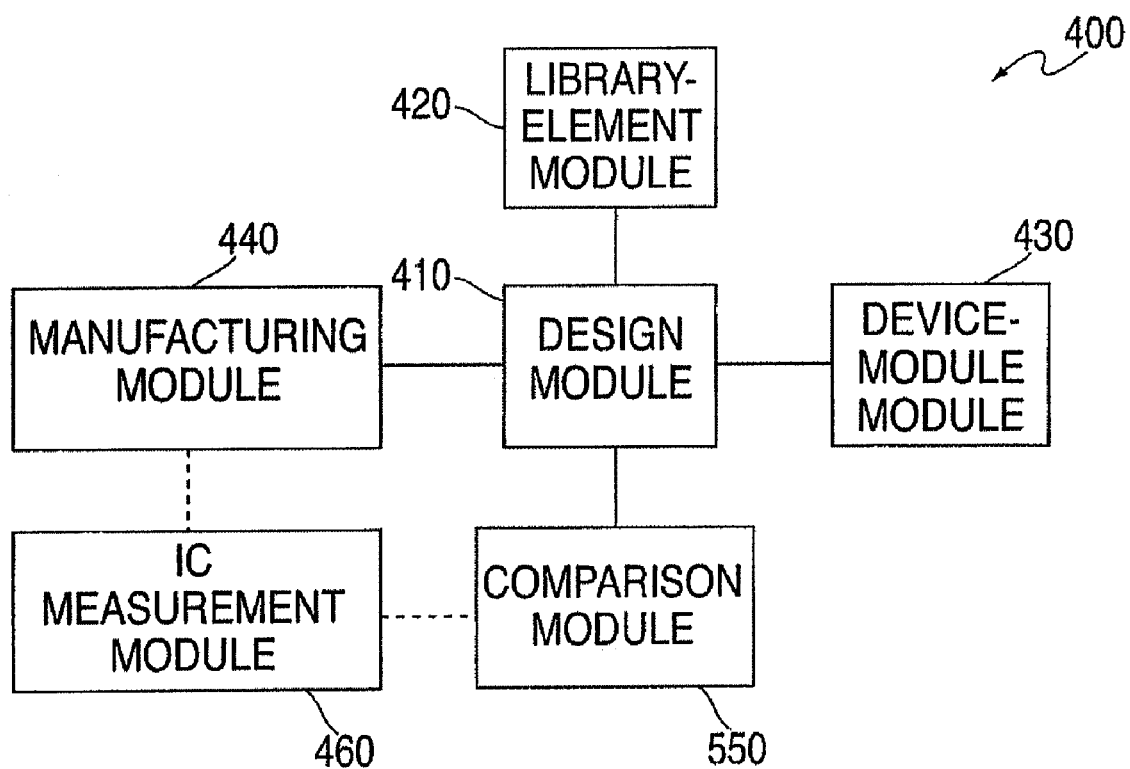
FIG. 4 is a high-level schematic diagram of an IC development system of the present invention.

Referring next to FIG. 4, and also FIGS. 1A-1D, FIG. 4 illustrates an IC development system 400 of the present invention. IC development system 400 may include a design module 410 that provides a graphical user interface for creating an IC design model of the present invention, such as computer model 140. Design module 410 may include a computing device having a processor, memory, input device, such as a keyboard and/or a pointing device, and a display controller, among other things. Examples of computing devices that are contemplated to display information for the system of the present invention include, but are not limited to, a personal computer, mainframe terminal, a thin-client device, a personal data assistant (PDA), a mobile communications device, or any other device that may function as a workstation.

Design module 410 may communicate with a library-element module 420 that contains one or more library elements of the present invention, such as library elements 150A-F that each include at least one module port 160A-F. It is noted that library-element module 420 may also include conventional library elements, i.e., library elements that do not include module ports, as appropriate. Library-element module 420 stores one or more library elements for use during the creation of the IC computer model using design module 410. In one aspect of the present invention, design module 410 may be used to select and manipulate library elements from library-element module 420 so as to model the structure of an integrated circuit design. In another aspect, design module 410 and/or library-element module 420 may be used to create and store new library elements in the library-element module.

Design module 410 may also communicate with a device block module 430 that contains one or more sets of device modules of the present invention, such as device modules 170. Device block module 430 stores one or more device blocks for use during the creation of an IC computer model using design module 410. In an aspect of the present invention, design module 410 may be used to populate the module ports of the library elements in a particular IC computer model using the device modules stored in device-block module 430. In another aspect of the present invention, design module 410 may be used to create device modules, assign property values thereto, and store newly created device modules in device-block module 430.

IC development system 400 may optionally include a manufacturing module 440 that includes one or more manufacturing process lines that produce integrated circuit devices. In another aspect of the present invention, an IC computer model, such as computer model 140, may be created using design module 410 and communicated to manufacturing module 440 for production of the device containing the integrated circuitry, e.g., integrated circuitry 110, corresponding to the IC computer model. One or more offset property values, as discussed above in connection with IC manufacturing method 300 of FIG. 3, may be determined in a manner such as, but not limited to, manually, automatically, or combination thereof. Determining of the offset property values may be performed by manufacturing module 440 or, alternatively, using testing equipment that may not be considered to be part of the manufacturing module. Once the offset property values have been determined, they may then be communicated to design module 410. Design module 410 may be operatively configured to determine where device modules swapping should occur, if any, and, optionally, which device modules must be swapped in, as a function of the offset property values.

IC development system 400 may also optionally include a comparison module 450 operatively configured to automatically collect manufacturing data from manufacturing module 440 related to one or more manufacturing property values. The manufacturing data may include, but not be limited to, sample test results, process parameters, test sites or any combination thereof. Comparison module 450 may also store one or more design property values related to an IC computer model. Comparison module 450 may then determine one or more offset property values, as discussed above, and automatically select one or more device blocks that must be replaced in the existing IC computer model. This selection may be communicated to design module 410, such that the design module may retrieve the necessary device blocks from the device block library 430 and populate the corresponding module ports. In connection with comparison module 450, IC development system 400 may also optionally include an IC measurement module 460. IC measurement module 460 may provide a platform for manufacturing property values to be measured, stored, communicated, or any combination thereof. IC measurement module 460 may be in communication with, but not limited to, manufacturing module 440 and comparison module 450 as needed.

Figure 5:
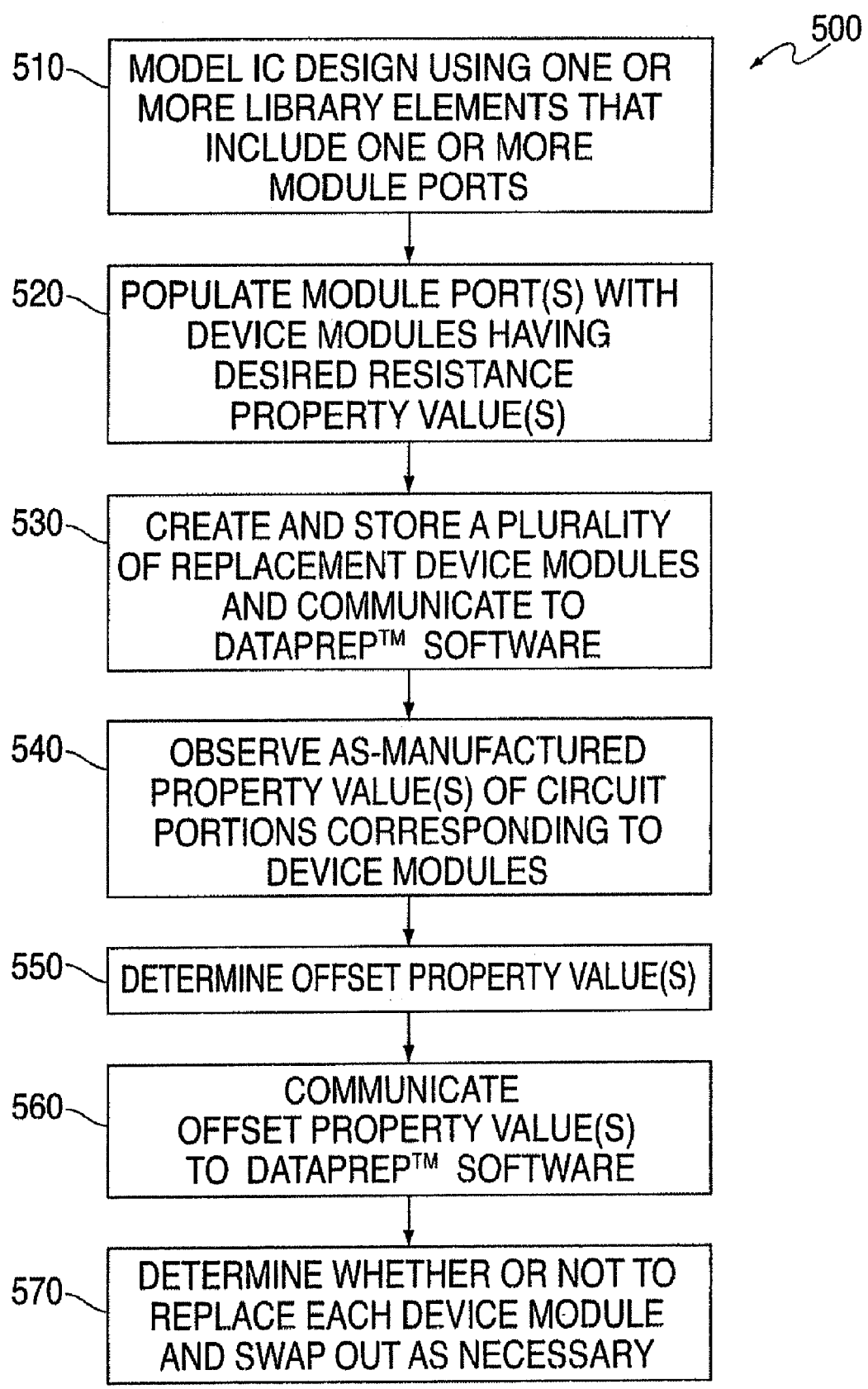
FIG. 5 is a flow diagram illustrating a method of using the IC development system of FIG. 4.

Referring next to FIG. 5, and also FIGS. 1A-1D and 4, FIG. 5 illustrates an exemplary method 500 that may be performed utilizing IC development system 400 of FIG. 4. At step 510, a computer model, such as computer model 140, of an IC design is modeled on design module 410 using one or more library elements of the present invention, such as library elements 150A-F, selected from library-element module 420. At step 520, design module 410 may be used to initially populate the module ports of computer model, e.g., module ports 160A-F, with initial device modules, such as device modules 170. In the present example, each device module 170 has a resistance property and a desired resistance property value.

At step 530, design module 410 and/or device-block module 430 may be used to create and store one or more sets of device modules 170 as appropriate for being swapped with the initial device modules installed at step 520. Also at step 530, the newly created device modules 170 may be communicated to software, e.g., manipulation software used to manipulate graphical shapes prior to sending to the manufacturing line. This software may reside in manufacturing module 440 and is commercially available and well known in the art. At step 540, measurement module 460 observes on the manufacturing line as-manufactured property values related to the resistance property values. At step 550, comparison module 450 determines offset property values by comparing the observed as-manufactured property values with corresponding respective design resistance property values. At step 560, comparison module 450 communicates the offset property values to the manipulation software. Based on the offset property values, at step 570 the manipulation software determines whether or not each module port 160A-F requires a new resistance property value and, if a new value is needed, the magnitude of the value. The software then replaces the affected device module(s) 170 with device modules having the appropriate property value(s).

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A method of developing a first integrated circuit (IC) design using a computer, the first IC desian of an IC, said method comprising:
   providing the computer with a model of the first IC design;
   providing, via the computer, a plurality of IC device modules each representing a common solid-state electrical-circuit device, said plurality of IC device modules having differing predetermined device property values each being an operating value of the common solid-state electrical-circuit device;
   building the model using an IC design library element that includes at least one module pod that corresponds to a portion of said model, said at least one module port configured to receive, in seriatim, ones of said plurality of IC device modules;
   selecting a first IC device module of said plurality of IC device modules based on the predetermined device property value of said first IC device module; and
   populating said at least one module port with said first IC device module so as to produce a first iteration of said model;
   determine a manufactured property value.

2. A method according to claim 1, further comprising modifying said IC design library element by re-populating said at least one module port using a second IC device module of said plurality of IC device modules, the predetermined device property value of said second IC device module differing from the predetermined device property value of said first IC device module.

3. A method according to claim 1, further comprising assigning a resistance property value to each IC device module of said plurality of IC device modules.

4. A method according to claim 1, further comprising:
   determining a critical offset property value; and
   re-populating said at least one module port using a second IC device module of said plurality of IC device modules as a function of said critical offset property value.

5. A method according to claim 1, wherein said plurality of IC device modules have a corresponding range of property values related to a variance in said property values in integrated circuits manufactured on a manufacturing line.

6. A method according to claim 1, further comprising:
   determining an offset property value between a desired design property value and said manufacturing property value; and
   re-populating said at least one module port using a second IC device module of said plurality so as to produce a second IC design.

7. A method according to claim 6, wherein said determining step includes:
   measuring said manufacturing property value on a sample manufactured IC of said first IC design; and
   comparing said manufacturing property value against an expected design property value for said first IC design to determine said offset property value.

8. A method according to claim 1, wherein said operating value is selected from the group consisting of a resistance, a capacitance, an inductance, an admittance, an impedance, or any combination thereof.

9. A method according to claim 1, wherein said first IC device module includes a computer model of a device element selected from the group consisting of a resistor, a capacitor, a transistor, a device cell, or any combination thereof.

10. A method according to claim 1, further comprising manufacturing an IC according to said first IC design.

11. A method for facilitating integrated circuit (IC) development using flexible IC design elements combined to form an IC design of an IC, the method comprising:
   providing a computer with a model of an IC;
   providing, via the computer, a plurality of IC device modules each representing a common solid-state electrical-circuit device, said plurality of IC device modules having differing predetermined device property values each being an operating value of said common solid-state electrical-circuit device;
   providing at least one library element for use in designing said IC, said at least one library element having at least one module port configured for receiving, in seriatim, ones of said plurality of IC device modules;
   populating said at least one module port with a first IC device module of said plurality of IC device modules so as to produce a first IC design, said first IC device module having a desired value for said corresponding predetermined device property value;
   measuring an as-manufacturing property on a sample IC of said first IC design so as to determine an as-manufactured property value;
   determining an offset property value as a function of said as-manufactured property value;
   using said offset property value to select a second IC device module of said plurality of IC design modules; and
   re-populating said at least one module port with said second IC device module so as to produce a second IC design.

12. A method according to claim 11, further comprising assigning a resistance property value to each IC device module of said plurality of IC device modules.

13. A method according to claim 11, wherein each of said operating value is selected from the group consisting of resistance, capacitance, inductance, admittance, impedance, or any combination thereof.

14. A method according to claim 11, wherein each of said first and second IC device modules includes a computer model of said common solid-state electrical-circuit device selected from the group consisting of a resistor, a capacitor, a transistor, a device cell, or any combination thereof.

15. A method according to claim 11, wherein said plurality of IC device modules have a range of property values related to a variance in said property value in integrated circuits manufactured on a manufacturing line.

16. A computer readable medium containing computer executable instructions for implementing a method for facilitating integrated circuit (IC) development using flexible design elements combined to form an IC design of an IC, the computer executable instructions comprising:
   a first set of computer executable instructions for receiving a model of an IC;
   a second set of computer executable instructions for selecting an IC design library element for use in designing an integrated circuit, said library element having at least one module port configured to receive an IC device module;
   a third set of computer executable instructions for storing and retrieving ones of a set of IC device modules having differing predetermined device property values each being an operating value of a common solid-state electrical-circuit device, each IC device module of said set configured to communicatively engage said at least one module port; and
   a fourth set of computer executable instructions for populating said at least one module port with a first IC device module of said set of IC device modules to produce a first IC design, said first IC device module having a desired value for said corresponding predetermined device property value;
   determine a manufactured property value.

17. A computer readable medium according to claim 16, further comprising:
   a fifth set of computer executable instructions for measuring an as-manufacturing property on a sample integrated circuit of said first IC design so as to determine said as-manufactured property value;
   a sixth set of computer executable instructions for determining an offset property value as a function of said as-manufactured property value;
   a seventh set of computer executable instructions for using said offset property value to select a second IC device module of said set; and
   a eighth set of computer executable instructions for re-populating said at least one module port with said second IC device module so as to produce a second IC design.

18. A computer readable medium according to claim 17, further comprising an ninth set of computer executable instructions for communicating said second IC design to a manufacturing line.

19. A computer readable medium according to claim 16, wherein said operating value is selected from the group consisting of resistance, capacitance, inductance, admittance, impedance, or any combination thereof.

20. A computer readable medium according to claim 16, wherein said solid-state devices are selected from the group consisting of a resistor, a capacitor, transistor, device cell, or any combination thereof.

* * * * *